United States Patent [19]

Jones et al.

[11] 4,370,746
[45] Jan. 25, 1983

[54] MEMORY ADDRESS SELECTOR

[75] Inventors: Robert E. Jones, Fishkill; Donald H. Wood, Hopewell Junction, both of N.Y.

[73] Assignee: International Business Machines Corporation, Armonk, N.Y.

[21] Appl. No.: 219,656

[22] Filed: Dec. 24, 1980

[51] Int. Cl.³ .................... G01R 31/28; G11C 29/00
[52] U.S. Cl. .................... **371/27; 324/73 R;
371/21; 371/25**
[58] Field of Search ............ 371/27, 21, 25;
324/73 R; 364/200, 900

[56] References Cited

U.S. PATENT DOCUMENTS

| | | | |
|---|---|---|---|
| 3,032,191 | 5/1962 | Clukey | 209/75 |
| 3,351,915 | 11/1967 | Fought et al. | 364/900 |
| 3,544,777 | 12/1970 | Winkler | 371/25 |
| 3,614,608 | 5/1969 | Giedd et al. | 324/73 R |
| 3,636,443 | 1/1972 | Singh et al. | 324/73 R |
| 3,657,527 | 4/1972 | Kassabgi et al. | 371/25 |
| 3,846,759 | 11/1974 | Drake et al. | 364/200 |
| 3,873,818 | 3/1975 | Barnard | 371/25 |
| 3,982,229 | 9/1976 | Rouse et al. | 364/900 |
| 4,300,234 | 11/1981 | Maruyama et al. | 371/27 |

OTHER PUBLICATIONS

Sellers, Jr. et al., Error Detecting Logic for Digital Computers, McGraw-Hill Book Co., 1968, pp. 207-211.

Primary Examiner—Charles E. Atkinson
Attorney, Agent, or Firm—Sughrue, Mion, Zinn, Macpeak & Seas

[57] ABSTRACT

A testing apparatus, having an address generator for providing address signals to a test device and to a reference device, is provided with a programmable mask for passing only selected least significant X and Y address bits to the reference device.

9 Claims, 5 Drawing Figures

FIG. 4
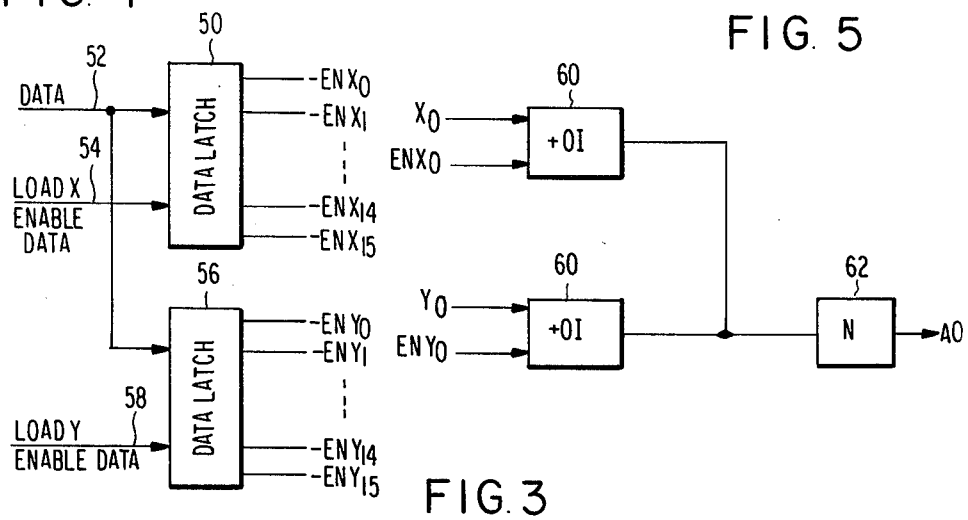
FIG. 5
FIG. 3
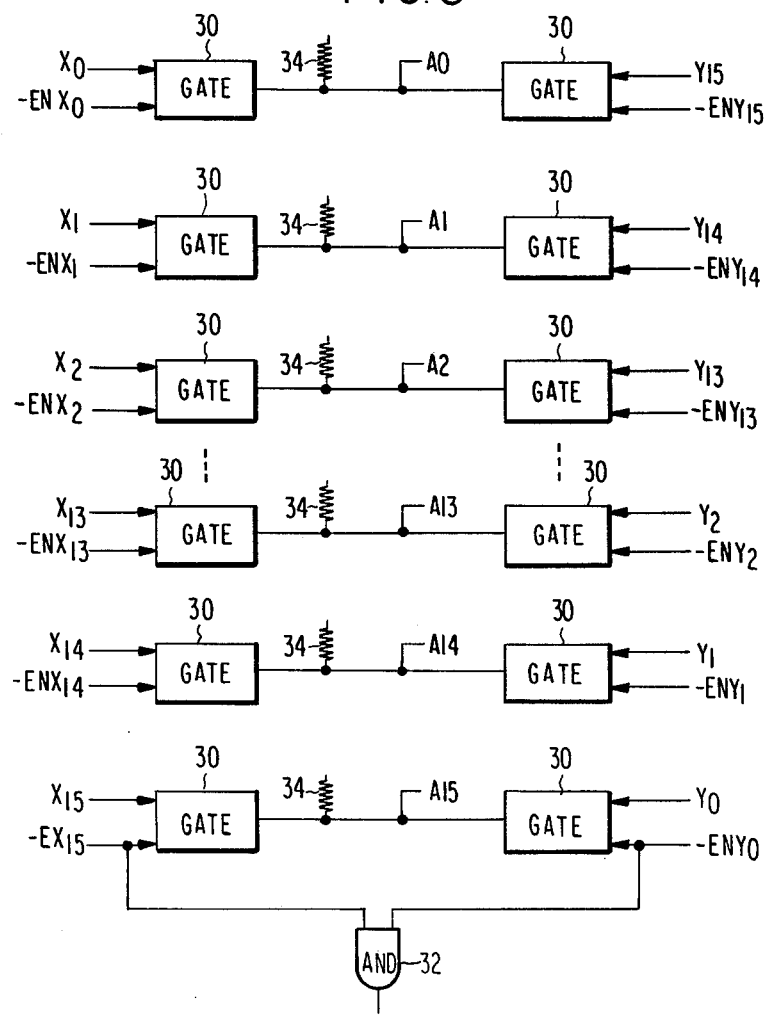

MEMORY ADDRESS SELECTOR

BACKGROUND OF THE INVENTION

This invention relates to the testing of memory array devices, more particularly to an apparatus for performing such tests.

It is often necessary to test an integrated circuit device. e.g., immediately after manufacturing such a device or while performing repairs, and this is typically done by providing a common input to both the device under test (DUT) and to a standard, or reference, device. The outputs of the two devices are then compared, with any disagreement indicating a failure. In the testing of memory array devices, data is supplied to the reference and test memories along with common address signaling designating storage locations. The memories are then read out, again using common address signaling, and the outputs are examined for any disagreement.

If the memory testing system is designed to test only a single memory, a standard memory of the same configuration as the test memory can be employed with an address generator compatible with both memories. However, in the case of an independent testing unit which is intended to test a wide variety of products, a memory under test will not always be of the same configuration as the standard memory. For example, memories are generally some X size by some Y size, and an 8 Kbit memory may be configured with 32 X lines and 256 Y lines requiring five X address line inputs and eight Y address line inputs. A different memory may be a 64 Kbit memory requiring twelve X address lines and four Y address lines. To ensure that the memory tester is capable of addressing any memory configuration, it would be preferable to utilize an address generator having a 24-bit address output capability, i.e. a 12-bit X address and a 12-bit Y address.

If a standard memory is employed which is capable of accepting either a 12-bit X address or a 12-bit Y address, a memory capacity of 16 megabits will be required. This would be extremely wasteful and expensive, since the largest memory to be tested may be 64 Kbits. This problem is further compounded if a testing device is designed to test other devices which may require as many as 16 bits of either an X input or a Y input, thus necessitating an address generator having a 32-bit output. A standard memory having the same capacity as the address generator would have approximately 64 megabits of memory capacity.

By way of Example, FIG. 1 illustrates a memory testing configuration in which random data is supplied from data generator 10 and, in response to a write signal on line 12, the data is stored in both a standard memory 14 and test memory 16 at addresses determined by random address generator 18. Subsequently, in response to a read pulse on line 12, the data is then read out of the memories 14 and 16 in response to random addresses from address generator 18, and the outputs are compared in error logic circuitry 20. The test memory 16 may have any one of a variety of configurations but, for the purposes of this explanation, it will be assumed to have a maximum memory capacity 64 Kbits. Accordingly, the memory 16 may require an address signal of up to 16 bits divided between the X and Y dimensions of the memory in any number of ways. For example, the memory may require a 4-bit X address and a 12-bit Y address, or it could conceivably require merely a 16-bit X address input with no address in the Y direction. In order to provide the capability of addressing any memory configuration of up to 64 Kbits, the address generator 18 must be capable of providing up to 16 bits of address in either the X or Y directions, thus requiring a 32 bit address generation capacity. If the address to the test memory, for example, must be a 4X by 12Y address, the first twelve X address bits and the first four Y address bits will simply be ignored.

A problem, however, arises with the standard memory 14. As mentioned above, a 64 megabit memory would be required to accommodate all of the 32-bit output of the address generator 18. This need for excessive memory capacity could be eliminated by utilizing a standard memory having the same configuration as the test memory and by also using an address generator providing the proper number of address outputs, but the flexibility of the testing apparatus would be lost in that the apparatus would be capable of testing only a single memory of fixed size and configuration.

SUMMARY OF THE INVENTION

It is an object of this invention to provide a testing device which is capable of testing a wide variety of products including memories of varying configurations, yet utilizes a standard memory of capacity not substantially larger than the capacity of the largest memory to be tested.

Briefly, the memory tester according to the present invention utilizes an address generator having a large address generating capability, e.g. 32 bits, in conjunction with a standard memory approximately the same size as the largest memory to be tested, preferably between 4 Kbits and 64 Kbits and thereby requiring between 12 and 16 bits of address input. Programmable masking circuitry is used to select the least significant bits of the X and Y address outputs from the address generator, since those are the bits used to address the device under test. In the case of an address generator having a 32 bit output, the masking circuitry preferably includes 32 tri-state gates each of which receives a different address generator output and passes the output in response to an enabling signal. The gates are arranged in gate pairs in reverse numerical order, i.e. the address generator outputs $X_0$–$X_{15}$ are paired with address generator outputs $Y_{15}$–$Y_0$, respectively, with the outputs of the gates in each gate pair being coupled together to provide one of the address inputs to the standard memory. Programmable X and Y latches are used to provide the appropriate combinations of enabling signals to the X and Y gates, respectively, in the gate pairs. A pull-up resistor is coupled to the combined output of each gate pair so that a known value will be supplied to the standard memory in the event that neither gate in a particular pair is enabled.

An alternative configuration suitable for very high speed applications utilizes Emitter Coupled Logic (ECL) with the tri-state gates being replaced by dottable emitter follower logic.

BRIEF DESCRIPTION OF THE DRAWINGS

The present invention will be more clearly understood from the following description in conjunction with the accompanying drawings in which:

FIG. 3 is a more detailed diagram of the gate configuration employed in the selector logic of FIG. 2;

FIG. 4 is a block diagram of the gate enabling portion of the selector logic of FIG. 2; and FIG. 5 is a block diagram of an alternative embodiment of the gate circuitry according to the present invention utilizing dottable ECL circuits.

DETAILED DESCRIPTION OF THE INVENTION

Figure 1:
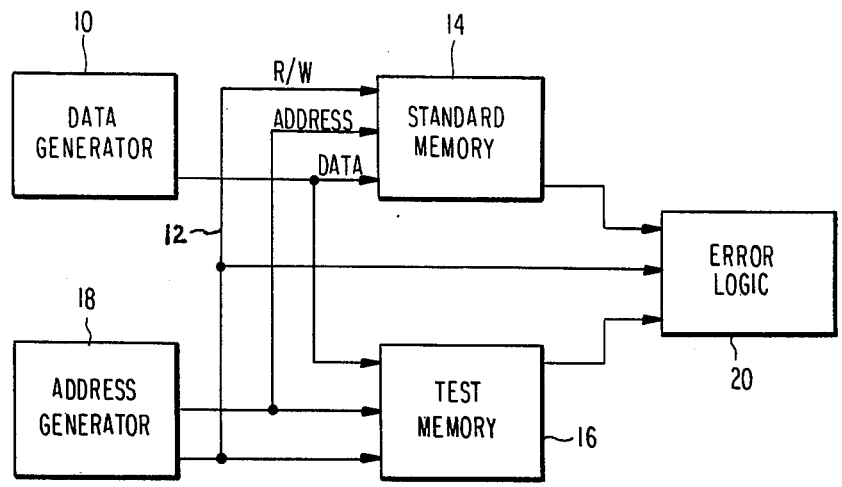
FIG. 1 is a brief block diagram of a conventional memory testing apparatus.
Figure 2:
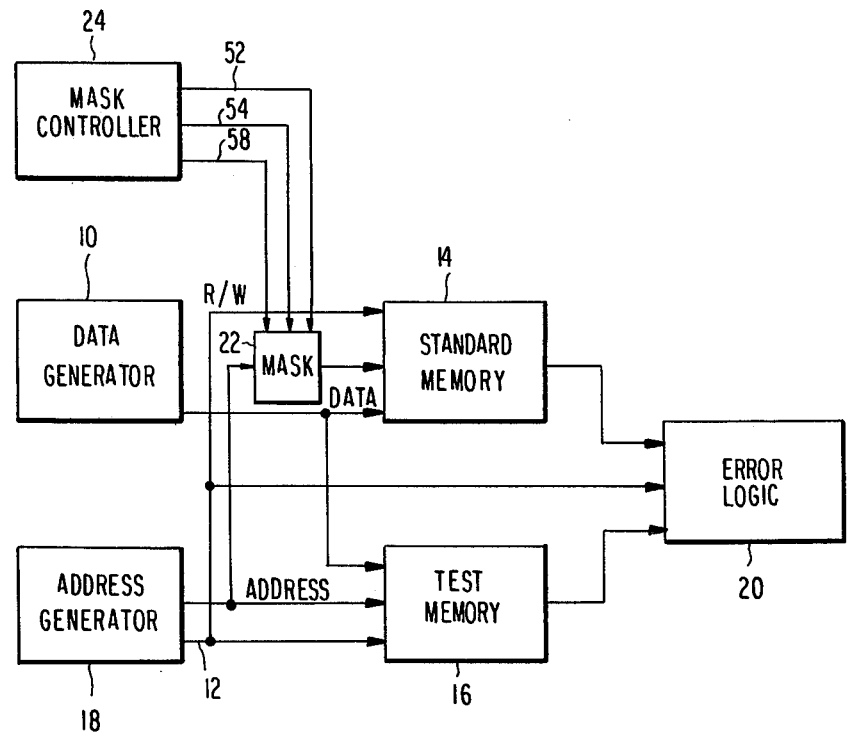
FIG. 2 is a block diagram of a memory testing apparatus according to the present invention.

The present invention will now be described with reference to FIG. 2. According to the present invention, a programmable selection circuit, or mask, 22 is provided between the address generator 18 and the address inputs to the standard memory 14. This mask will select only those address generator outputs which are actually used to address the test memory 16, and it will provide these address signals to the standard memory 14. The standard memory 14 can thus be of any configuration as long as it has the maximum memory capacity of 64 Kbits, and the address provided to the standard memory 14 will be in the form of a one-dimensional 16-bit address which uniquely identifies a standard memory bit corresponding to a particular bit in the test memory. The particular address generator output bits to be selected are controlled from a mask controller 24 as will be described in more detail below.

For the purposes of the following discussion, it will be assumed that the largest memory to be tested is 64 Kbits, and that the capacity of the standard memory must equal this. Accordingly, the standard memory 14 will require 16 bits of address. It is also assumed that the address generator 18 provides sixteen X address outputs designated $X_0$–$X_{15}$, and sixteen Y address outputs designated $Y_0$–$Y_{15}$. In connecting the test memory 16 to the testing device, the required number of least significant X and Y outputs from the address generator will be connected to the address inputs of memory 16, and the remaining address generator outputs can be blocked out or masked in a well-known manner.

Since the least significant X and Y outputs from the address generator 18 are used to address the test memory 16, the mask 22 must select the same combination of least significant address bits, and this is accomplished utilizing a gate configuration as shown in FIG. 3. The mask circuitry 22 will include thirty-two gates 30 each of which receives one of the address generator outputs $X_0$–$X_{15}$ and $Y_0$–$Y_{15}$. Each gate 30 will pass this address signal to its output terminal in response to a corresponding enabling signal. Further, since only the least significant of the X and Y address signals are to be selected, the X and Y gates are connected in gate pairs in reverse numerical order, i.e. the outputs of the $X_0$ and $Y_{15}$ gates are coupled together, the outputs of the $X_1$ and $Y_{14}$ gates are coupled together, etc. In the case of a test memory requiring four X and twelve Y address inputs, the $X_{12}$–$X_{15}$ and $Y_4$–$Y_{15}$ gates will all be enabled while all other gates are disabled. Thus, the standard memory address inputs $A_0$–$A_{11}$ will correspond to address generator output signals, $Y_{15}$–$Y_4$, respectively, and the standard memory inputs $A_{12}$–$A_{15}$ will correspond to the address generator outputs $X_{12}$–$X_{15}$, respectively.

In order to ensure that no two gates in any one gate pair are simultaneously enabled, the enabling inputs to each gate pair can be combined in AND gates 32, the output of which would indicate an illegal combination.

In order to simplify the drawings, only a single AND gate 32 has been illustrated, but it should be appreciated that the enabling inputs to all of the gate pairs would be connected in a similar manner.

If the test memory is small in comparison to the standard memory, for example if the test memory is only a 4 Kbit memory in which the combined X and Y address inputs will only total 12 bits, it will not be necessary to supply an entire 16 bits of address to the standard memory. However, since the address to the standard memory 14 will consist of 16 bits $A_0$–$A_{15}$, only 12 of which will correspond to the address of the test memory, the remaining four bits should be maintained at a known value so that they will not affect the operation of the standard memory, For instance, if the address to the test memory consists of address signals $X_{10}$–$X_{15}$ and $Y_{10}$–$Y_{15}$, the address to the test memory will include only 12 bits, and it will be necessary to ensure that these same 12 bits determine the storage and read out locations in standard memory 14. If the test memory address consists of address signals $X_{10}$–$X_{15}$ and $Y_{10}$–$Y_{15}$, the four intermediate gate pairs combining signals $X_6$–$X_9$ and $Y_9$–$Y_6$, respectively, will be superfluous and should be maintained at a constant value. Accordingly, all gates 30 are preferably tri-state gates, and pull-up resistors 31 are included to ensure that a known value will be supplied as an address signal to the standard memory if neither gate in any one gate pair is enabled.

FIG. 4 is a brief diagram of one technique which may be used to control the gate circuitry shown in FIG. 3. A latch 50 will receive a data word on line 52 and will store that word in response to a load signal on line 54. Similarly, latch 56 will receive its data word on line 52 and store that word in response to a load signal on line 58. The latches 50 and 56 will provide enabling signals to the $X_0$–$X_{15}$ and $Y_0$–$Y_{15}$ gates, respectively, in accordance with the data stored in each latch. The mask controller 24 which provides the enabling data and load signals to the latches 50 and 56 may be a computerized testing control system which automatically provides the appropriate mask data to latches 50 and 56 when the part number of the test device is specified. Alternatively, a simple keyboard could be used to manually select the proper address bits.

The memory tester according to the present invention provides the advantages of random data generation, random address generation, and programmable X and Y address fields of up to 16 bits each, and it provides these advantages with a minimum amount of commercially available logic circuitry. Further, it is suitable for high speed operation due to the equal length logic delay path for all outputs. It could be modified for very high speed applications as shown in FIG. 5, by using emitter coupled logic (ECL), with the tri-state gates being replaced with dottable emitter follower circuits 60 of the type well-known in the art. Gates 60 should preferably be of the type wherein a positive-or-invert (+OI) operation is performed, i.e., if either input to the gate is high, its output will be low. The same enabling signal is supplied as an input to each gate. If either gate output is high, the input to inverter 62 will be high and the resulting address output bit will be low.

It should be appreciated that various modifications could be made to the disclosed invention without departing from the spirit and scope of the invention as defined in the following claims.

What is claimed is:

1. In a testing apparatus of the type including a standard device for providing an output in response to N address signals received on N address input lines, a test device for providing an output in response to address signals received on a plurality of address lines, an address generator for providing address signals to said standard and test devices, and means for comparing the outputs from said two devices, the improvement comprising:

said address generating means providing M address signals on M address output lines, $M \geq N$; and programmable masking means for selecting N of said M address signals to be supplied as the N address signals to said standard device.

2. A testing apparatus as defined in claim 1, wherein said programmable masking means comprises:

a plurality of gates each of which passes an address signal from said address generator in response to a respective enabling signal; and means for selectively providing enabling signals to said plurality of gates.

3. A testing apparatus as defined in claim 2, wherein said standard and test devices are memory array devices.

4. A testing apparatus as defined in claim 3, wherein said address generator provides a plurality of X address signals and a plurality Y address signals and said plurality of gates are connected in pairs with one gate in each pair receiving a respective X address signal from said address generator and one gate in each pair receiving a Y address signal from said address generator, the outputs of the gates in each pair being coupled together to provide one of said N address signals to said standard device.

5. A testing apparatus as defined in claim 4, wherein said gates are tri-state gates and a pull-up resistor is coupled to the outputs of each gate pair whereby the address signal provided by said gate pair will assume a known value when neither of the gates in said pair is enabled.

6. A testing apparatus as defined in claim 4, wherein said X address signals are designated $X_0$-$X_I$ and said Y address signals are designated $Y_0$-$Y_I$, and said X and Y address signals are paired in reverse numerical order with signals $X_0$-$X_I$ being combined in said gate pairs with signals $Y_I$-$Y_0$, respectively.

7. A testing apparatus as defined in claim 4, wherein said gates are emitter coupled logic (ECL) gates having dottable outputs.

8. A testing apparatus as defined in claim 4, further comprising AND logic means for providing an output signal when both gates in any one gate pair are enabled.

9. A testing apparatus as defined in any one of claims 2-7, wherein said means for selectively providing said enabling signals comprises:

latch means for receiving enabling data and storing said enabling data in response to a load signal, said latch means providing enabling signals at its output in accordance with said enabling data; and control means for providing said data and load signals to said latch means.

* * * * *